United States Patent
Tseng et al.

(10) Patent No.: US 6,627,515 B1
(45) Date of Patent: Sep. 30, 2003

(54) METHOD OF FABRICATING A NON-FLOATING BODY DEVICE WITH ENHANCED PERFORMANCE

(75) Inventors: Horng-Huei Tseng, Hsin-Chu (TW); Jyh-Chyurn Guo, Hsinchu (TW); Chenming Hu, Hsinchu (TW); Da-Chi Lin, Hsin Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/318,471

(22) Filed: Dec. 13, 2002

(51) Int. Cl.⁷ .................. H01L 21/76; H01L 21/00; H01L 21/336; H01L 21/302
(52) U.S. Cl. ............... 438/439; 438/149; 438/151; 438/197; 438/221; 438/222; 438/225; 438/226; 438/311; 438/353; 438/355; 438/357; 438/359; 438/362; 438/424; 438/412; 438/413; 438/442; 438/406; 438/733; 438/735; 438/745
(58) Field of Search .................. 438/149, 151, 438/197, 221, 222, 225, 226, 311, 353, 355, 357, 359, 362, 424, 412, 413, 442, 406, 733, 735, 745

(56) References Cited
U.S. PATENT DOCUMENTS 6,251,751 B1 * 6/2001 Chu et al.
6,255,147 B1 * 7/2001 Buynoski
2002/0008289 A1 * 1/2002 Murota et al.
2002/0125502 A1 * 9/2002 Baba et al.

* cited by examiner

Primary Examiner—John F. Niebling
Assistant Examiner—Stanetta Isaac
(74) Attorney, Agent, or Firm—George O. Saile; Stephen B. Ackerman

(57) ABSTRACT

A method of forming a buried silicon oxide region in a semiconductor substrate with portions of the buried silicon oxide region formed underlying portions of a strained silicon shape, and where the strained silicon shape is used to accommodate a semiconductor device, has been developed. A first embodiment of this invention features a buried oxide region formed in a silicon alloy layer, via thermal oxidation procedures. A first portion of the strained silicon layer, protected during the thermal oxidation procedure, overlays the silicon alloy layer while a second portion of the strained silicon layer overlays the buried oxide region. A second embodiment of this invention features an isotropic dry etch procedure used to form an isotropic opening in the silicon alloy layer, with the opening laterally extending under a portion of the strained silicon layer. Subsequent silicon oxide deposition and planarization procedures results in a first portion of the strained silicon layer overlying the silicon alloy layer while a second portion overlays a buried oxide region. A semiconductor device is then formed in the strained silicon layer, with specific elements of the semiconductor device located on a buried oxide region.

38 Claims, 6 Drawing Sheets

METHOD OF FABRICATING A NON-FLOATING BODY DEVICE WITH ENHANCED PERFORMANCE

BACKGROUND OF THE INVENTION (1) Field of the Invention

The present invention relates to methods used to fabricate semiconductor devices, and more specifically to a method used to form portions of a device on an insulator layer without forming a floating body device.

(2) Description of Prior Art

Devices formed in silicon layers which in turn completely overlying insulator, have allowed reductions in performance degrading parasitic capacitances to be realized. The increased performance of devices fabricated using silicon on insulator (SOI), technology however is achieved at higher processing costs when compared to counterpart devices formed in, and only overlying, semiconductor material. The increased cost of SOI devices is attributed to the additional processing used to form the SOI layer, with a first option featuring bonding procedures, where one of the bonded wafers features the insulator layer, followed by thinning of the bonded semiconductor wafer. A second option, also resulting in increased processing cost, is formation of the SOI layer via implantation of oxygen ions into a semiconductor wafer followed by an anneal cycle resulting in an silicon oxide layer located underlying a thin portion of unimplanted silicon. In addition to the increased processing costs incurred with the SOI technology, the presence of an insulator layer on the entire surface of the semiconductor can result in a floating body effect, wherein the semiconductor substrate is floating with respect to the device channel region. This can result in unwanted threshold voltages thus adversely influencing designed operating conditions.

This invention will describe a method of fabricating a device where only portions of the device overlay insulator layer, wherein the overlaid insulator layer is buried oxide regions, not an entire insulator layer as is the case with SOI layers. The use of buried oxide regions still allow decreased parasitic capacitance and increased performance to be realized, without experiencing the negative device parameters encountered with SOI, floating body type devices. Prior art such as Chu et al, in U.S. Pat. No. 6,251,751 B1, Juengling, in U.S. Pat. No. 5,670,412, Huang, in U.S. Pat. No. 6,235,567 B1, and Chu et al, in U.S. Pat. No. 5,963,817, describe methods of forming buried oxide regions, however none of these prior art describe the unique combination of process steps of this present invention, allowing optimum buried oxide regions to be formed and overlaid by specific portions of a semiconductor device.

SUMMARY OF THE INVENTION

It is an object of this invention to fabricate a semiconductor device in a silicon layer, wherein specific portions of the device overlying an insulator shape.

It is another object of this invention to fabricate the semiconductor device in a silicon layer where a portion of the device overlays a silicon alloy layer, and where other portions of the device overlay an insulator shape, wherein the insulator shape is formed from oxidation of portions of the silicon alloy layer.

It is still another object of this invention to fabricate the semiconductor device in a silicon layer where a portion of the device overlays a silicon alloy layer, and where other portions of the device overlay an insulator shape, wherein the insulator shape is formed via insulator filling of an isotropically defined opening in the silicon alloy layer.

In accordance with the present invention a method of forming a semiconductor device in a silicon layer, wherein portions of the semiconductor device overlay a silicon alloy layer while other portions of the semiconductor device overlay an insulator shape formed in the silicon alloy layer, is described. After deposition of a silicon alloy layer on a,semiconductor substrate surface, a strained silicon layer is epitaxially grown. An oxidation resistant insulator layer is deposited followed by a patterning procedure resulting in a composite shape comprised of an oxidation resistant insulator shape on a strained silicon shape, exposing regions of the silicon alloy layer located between the composite shape. A first embodiment of this invention features formation of oxidation resistant spacers on the sides of the composite shapes, followed by an oxidation procedure used to form a silicon alloy oxide shape in regions of the silicon alloy located between the composite shapes, as well forming the silicon alloy oxide shape in portions of the silicon alloy layer underlying edges of the strained silicon shape. Removal of all oxidation resistant material results in a strained silicon shape, with a center portion of this shape overlying the silicon alloy layer, while edges of the strained silicon shape are located overlying the silicon alloy oxide shape. Subsequent device fabrication features the formation of specific device elements in regions of the strained silicon layer shape overlying the silicon alloy oxide shape.

A second embodiment of this invention again features the a composite shape on a silicon alloy layer, with the composite shape comprised of a silicon oxide shape on a strained silicon shape. After formation of silicon oxide spacers on the sides of the composite shapes, an isotopic dry etch procedure is used to remove portions of the silicon alloy layer located between composite shapes, as well as removing portions of the silicon alloy layer located under the edges of the silicon shape. Refilling of the isotropic openings in the silicon layer via deposition of a silicon oxide layer is followed by a planarization procedure, resulting in a strained silicon shape embedded by silicon oxide, with the center portion of the strained silicon layer overlying the silicon alloy layer while the edges of the strained silicon shape are located overlying the refilled silicon oxide layer. Subsequent device fabrication will feature the formation of specific device elements in regions of the strained silicon shape located overlying the silicon alloy oxide shape.

BRIEF DESCRIPTION OF THE DRAWINGS

The object and other advantages of this invention are best described in the preferred embodiments, with reference to the attached drawings that include.

DESCRIPTION OF THE PREFERRED EMBODIMENTS

Figure 1:
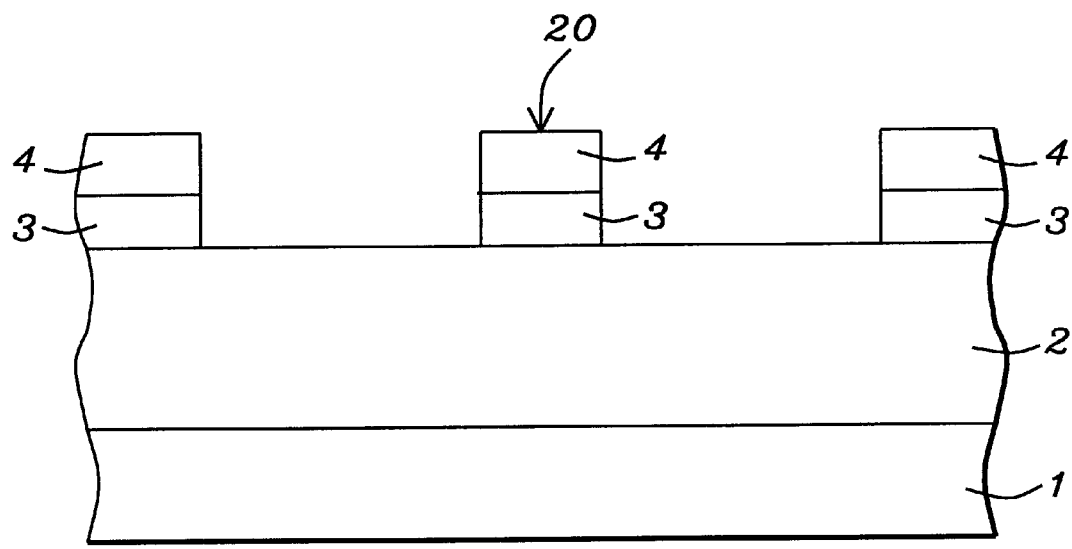
FIGS. 1–8, which schematically, in cross-sectional style, show a first embodiment of this invention in which a device is formed in a strained silicon shape, wherein portions of the device are formed in a region of the strained silicon shape located overlying a silicon alloy layer, while other portions of the device are formed in regions of the strained silicon shape located overlying thermally grown silicon oxide regions.

The method of forming a semiconductor device in a strained silicon shape, wherein portions of the device are formed in a region of the strained silicon shape located overlying a silicon alloy layer, while other portions of the device are formed in regions of the strained silicon shape located overlying silicon oxide regions, will now be described in detail. Semiconductor substrate 1, comprised of P type, single crystalline silicon, featuring a <100> crystallographic orientation, is used and schematically shown in FIG. 1. Silicon alloy layer 2, comprised of silicon-germanium or silicon-germanium-carbon, is next epitaxially grown on semiconductor substrate 1, using silane or disilane as a silicon source, while germane is used as a germanium source. Silicon alloy layer is grown to a thickness between about 100 to 10,000 Angstroms, with the silicon-germanium option denoted as $Si_{(1-y)}Ge_y$, wherein y is the mole percent of germanium, between about 5 to 55%. Silicon layer 3, is next formed silicon alloy layer 2, at a thickness between about 5 to 5,000 Angstroms, silane or disilane as a source. The growth procedures on an underlying silicon alloy layer, as well as an optional post-epitaxial growth anneal, result in strained silicon layer 3. The resulting strained silicon layer when used as a channel region for a subsequent metal oxide semiconductor field effect transistor (MOSFET) device, presents increased carrier mobility, and thus increased performance, when compared to counterpart MOSFET devices formed with non-strained channel regions. Silicon nitride layer 4, is next deposited via low pressure chemical vapor deposition (LPCVD), or plasma enhanced chemical vapor deposition (PECVD), procedures, to a thickness between about 100 to 1,000 Angstroms. Photolithographic and reactive ion etching (RIE), procedures are next employed to define composite shapes 20, each comprised of silicon nitride shape 4, and underlying strained silicon shape 3. The RIE procedure is performed using $Cl_2$ as an etchant for silicon nitride and for the strained silicon layer, with the procedure terminated at the appearance of silicon alloy layer 2. After definition of composite shapes 20, the photolithographic shape used as an etch mask, not shown in the drawings, is removed via plasma oxygen ashing procedures. The result of these procedures are schematically shown in FIG. 1.

Figure 2:
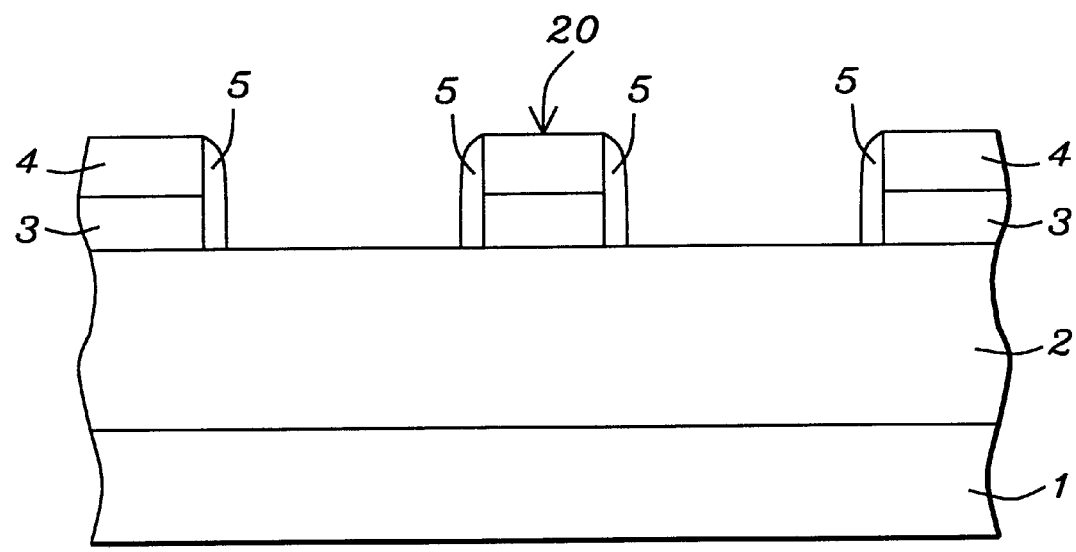

Silicon nitride spacers 5, are next formed on the sides of composite shapes 20, to protect strained silicon shapes 3, from a subsequent thermal oxidation procedure. A silicon nitride layer is deposited at a thickness between 50 to 1,000 Angstroms, via LPCVD or PECVD procedures, followed by an anisotropic RIE procedure performed using $Cl_2$ as an etchant, resulting in the definition of silicon nitride spacers 5. This is schematically shown in FIG. 2. A thermal oxidation procedure is next performed in an oxygen containing ambient, at a temperature between about 700 to 1200° C., resulting in the formation of silicon alloy oxide regions 6. Portions of silicon alloy oxide regions 6, at a thickness between about 2,000 to 12,000 Angstroms, are thermally grown in the areas of silicon alloy layer 2, exposed between composite shapes 20, while other portions of silicon alloy oxide regions 6, are formed underlying the edges of strained silicon shape 3. The top surface of the portions of silicon alloy oxide regions 6, located between composite shapes 20, is located above the strained silicon shape-silicon alloy layer interface. This is schematically shown in FIG. 3.

Figure 3:
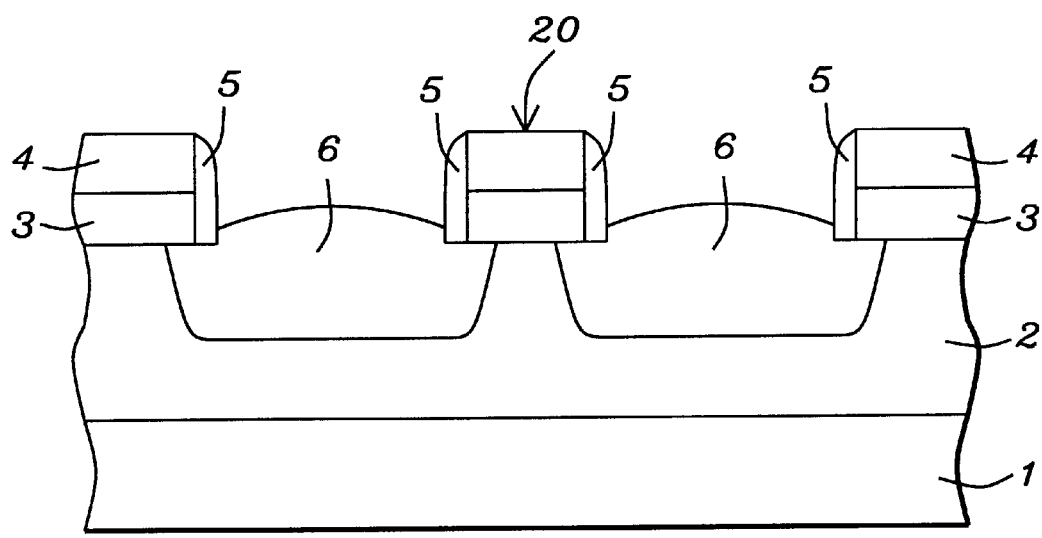
Figure 4:
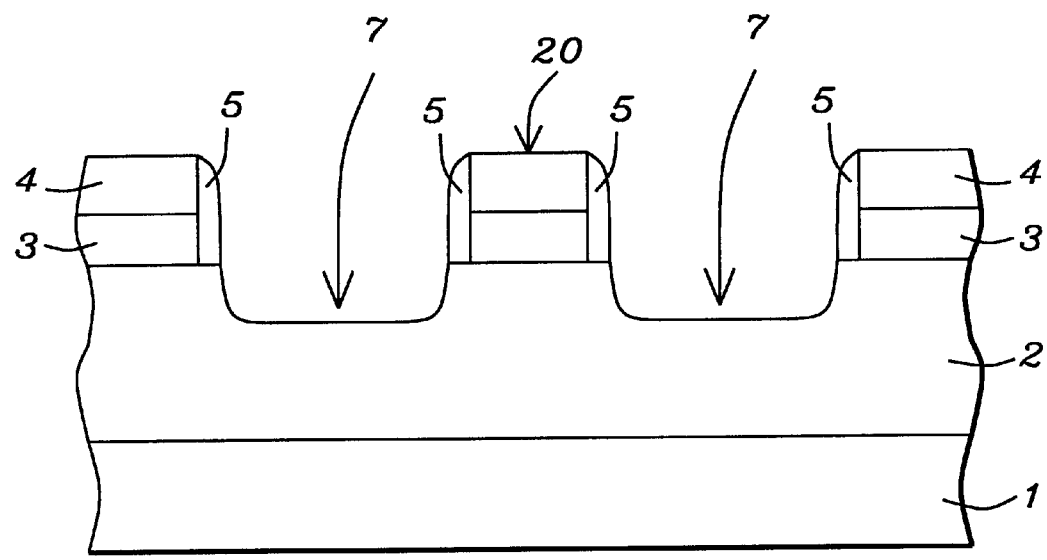
Figure 5:
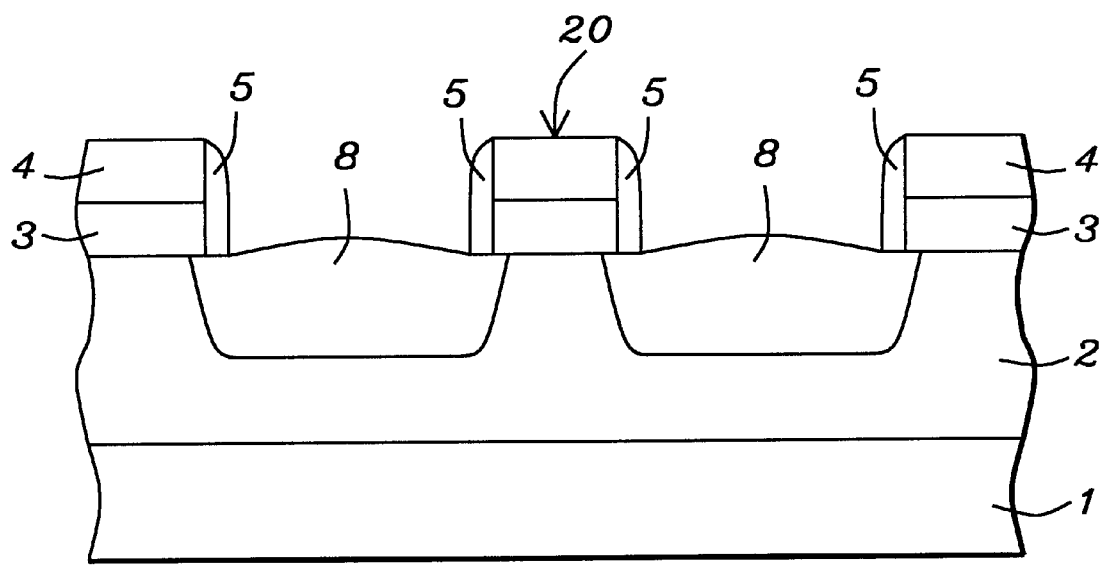

An iteration allowing the top surface of the silicon alloy oxide regions to be located at the same height as the strained silicon shape-silicon alloy layer interface, is next addressed and schematically shown using FIGS. 4–5. After definition of silicon nitride spacers 5, on the sides of composite shapes 20, a blanket RIE procedure is used to remove, and to recess, a to portion of silicon alloy layer 2, located between composite shapes 20. This is accomplished using $SF_6$ as a selective etchant for silicon alloy layer 2. The top surface of opening 7, schematically shown in FIG. 4, is now located below the strained silicon-silicon alloy layer interface. The thermal oxidation procedure previously described in FIG. 3, is again employed to form silicon alloy oxide regions 8, in openings 7, however with the top surface of silicon alloy oxide regions 8, now adjacent to the strained silicon shape-silicon alloy layer interface. Silicon alloy oxide regions 8, again thermally grown to a thickness between about 1,000 to 10,000 Angstroms, underlays a portion of, or the edges of strained silicon shape 3. This is schematically shown in FIG. 5.

Figure 6:
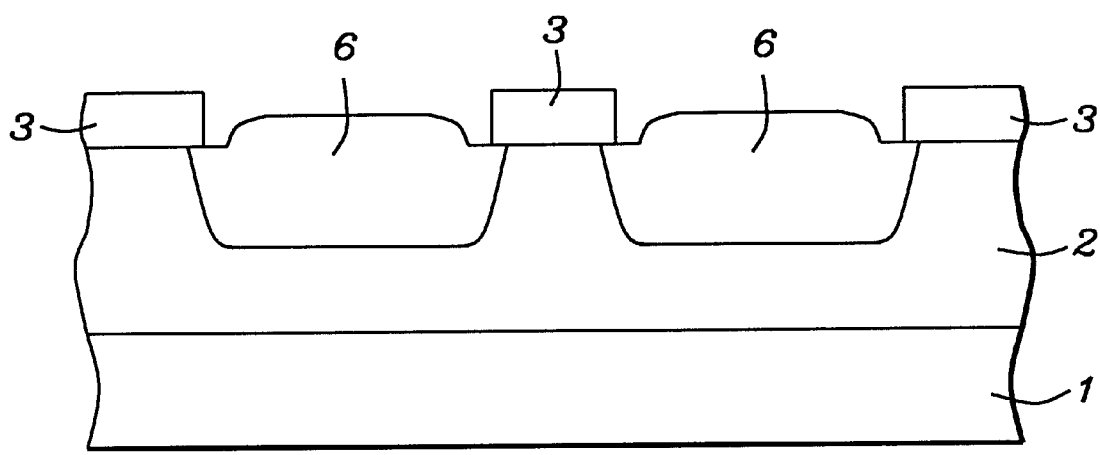
Figure 7:
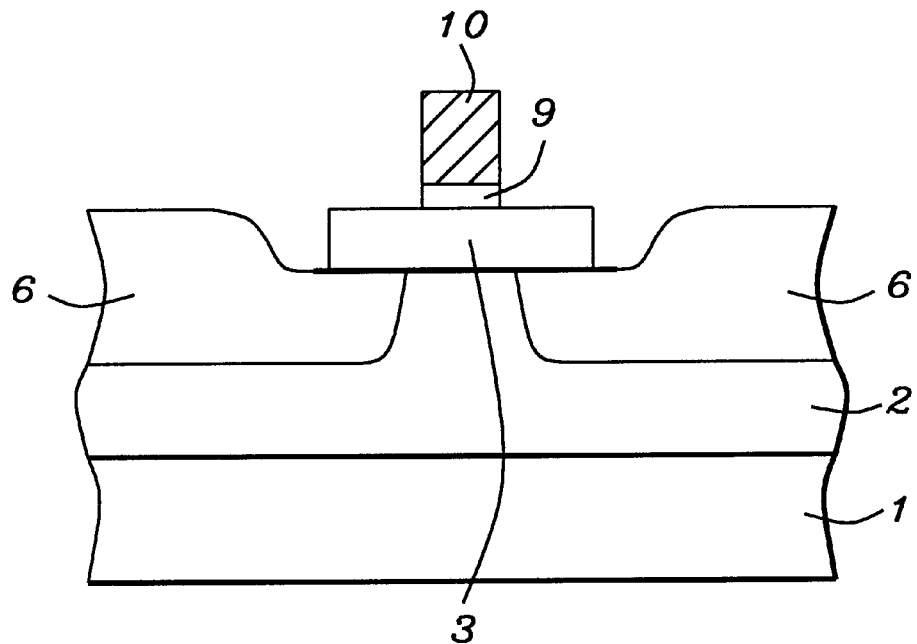

Returning to the structure shown in FIG. 3, a hot phosphoric acid solution is used to selectively remove silicon nitride shapes 4, as well as silicon nitride spacers 5. The resulting structure featuring strained silicon shape 3, with a center portion located on silicon alloy layer 2, and with peripheral or edges of the strained silicon shape located on silicon alloy oxide region 6, is schematically shown in FIG. 6. The fabrication of a MOSFET device in strained silicon shape 3, is next addressed and schematically described using FIGS. 7–8. Gate insulator layer 9, comprised of silicon dioxide is formed on the surface of strained silicon shape 3, to a thickness between about 5 to 100 Angstroms, via thermal oxidation procedures performed in an oxygen-steam ambient. A conductive layer such as a doped polysilicon, or metal silicide, at a thickness between about 500 to 3,000 Angstroms, is next formed on gate insulator layer 9, via chemical vapor deposition (CVD), procedures. The polysilicon layer can be doped in situ during deposition via the addition of arsine, phosphine, or diborane, to a silane or disilane ambient, or the polysilicon layer can be deposited intrinsically then doped via implantation of arsenic, phosphorous or boron ions. The metal silicide option can be a tungsten silicide, tantalum silicide, titanium silicide layer, obtained via CVD or via plasma vapor deposition procedures. A photoresist shape, not shown in the drawings, is used as an etch mask to allow an anisotropic RIE procedure to define gate structure 10, on gate insulator layer 9, using $Cl_2$ as a selective etchant. The result of these procedures is schematically shown in FIG. 7. The photoresist shape used to define gate insulator layer 9, is removed via plasma oxygen ashing and wet clean procedures, with a buffered hydrofluoric acid cycle, used as part of the wet clean procedure, removing portions of gate insulator layer 9, not covered by gate structure 10.

Figure 8:
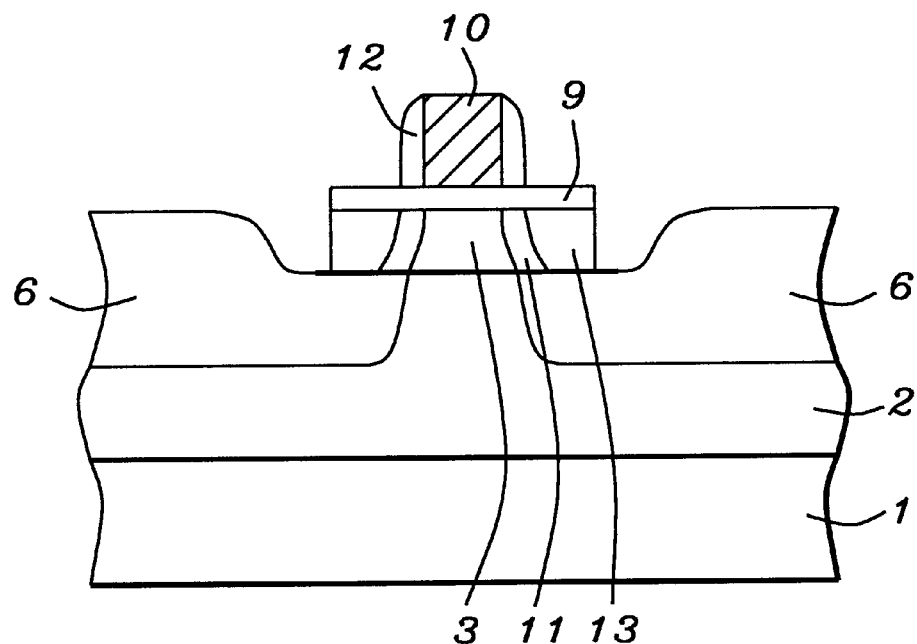

The example of the MOSFET device being formed in strained silicon shape 3, will be an N channel device therefore requiring N type source/drain regions. However if desired this invention can also be applied to P channel MOSFET devices, where P type source/drain regions would be formed. N type, lightly doped source/drain region 11, is formed in portions of strained silicon shape 3, not covered by gate structure 10, via implantation of phosphorous or arsenic ions, implanted at an energy between about 1 to 100 KeV, at a dose between about 1E13 to 1E15 atoms/cm². An insulator layer such as silicon oxide or silicon nitride is next deposited to a thickness between about 100 to 2,500 Angstroms, via LPCVD or PECVD procedures. An anisotropic RIE procedure, performed using $CHF_3$ as an etchant for the silicon oxide option, or using $Cl_2$ as an etchant for the silicon nitride option, is used to form insulator spacers 12, on the sides of gate structure 11. Heavily doped, N type source/drain region 13, is next formed in portions of strained silicon shape 3, not covered by gate structure 10, or by insulator spacers 12, via implantation of arsenic or phosphorous ions, implanted at an energy between about 1 to 100 KeV, at a dose between about 5E13 to 1E16 atoms/$cm^2$. An anneal cycle is used to activate the dopants in all source/drain regions. The result of these procedures is schematically shown in FIG. 8. The MOSFET device features a channel region located on silicon alloy layer 3, while the source/drain regions overlay silicon alloy oxide regions 6. The ability to form the source/drain regions on an underlying insulator region eliminates the junction capacitance, and performance decreases, encountered with counterpart MOSFET devices in which the source/drain regions are formed in the semiconductor substrate. In addition the ability to define the MOSFET channel region on an underlying conductive region, eliminates the floating body effect.

Figure 9:
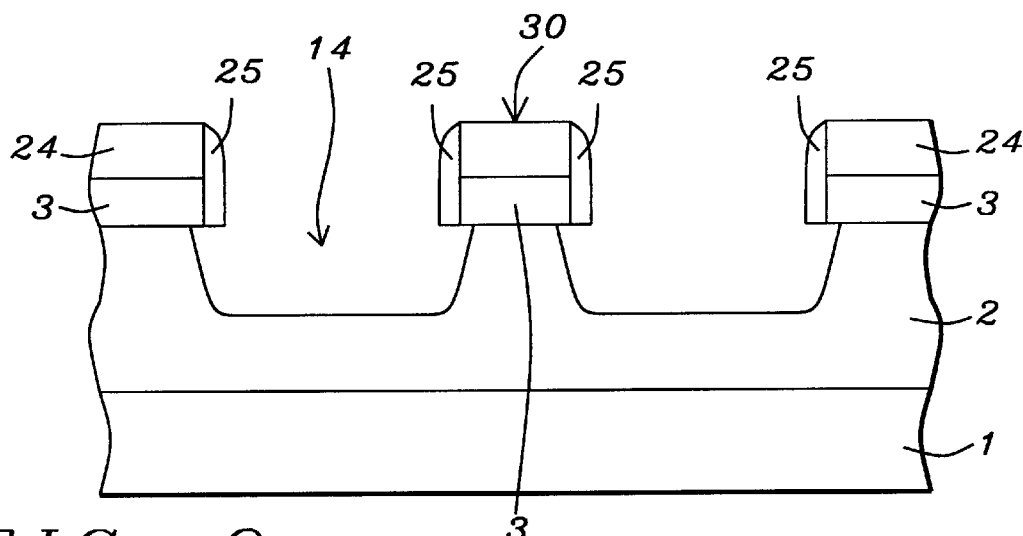
FIGS. 9–13, which schematically, in cross-sectional style, show a second embodiment of this invention in which a device is formed in a strained silicon shape, wherein portions of the device are formed in a region of the strained silicon shape located overlying a silicon alloy layer, while other portions of the device are formed in regions of the strained silicon shape located overlying a silicon oxide shape, wherein the silicon oxide shape was established via silicon oxide refill of an isotropically formed opening in the silicon alloy layer.
Figure 10:
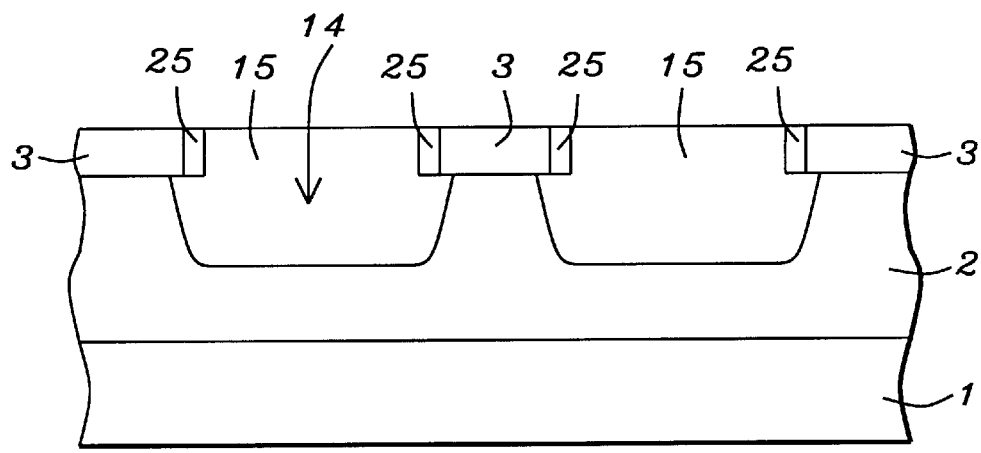
Figure 11:
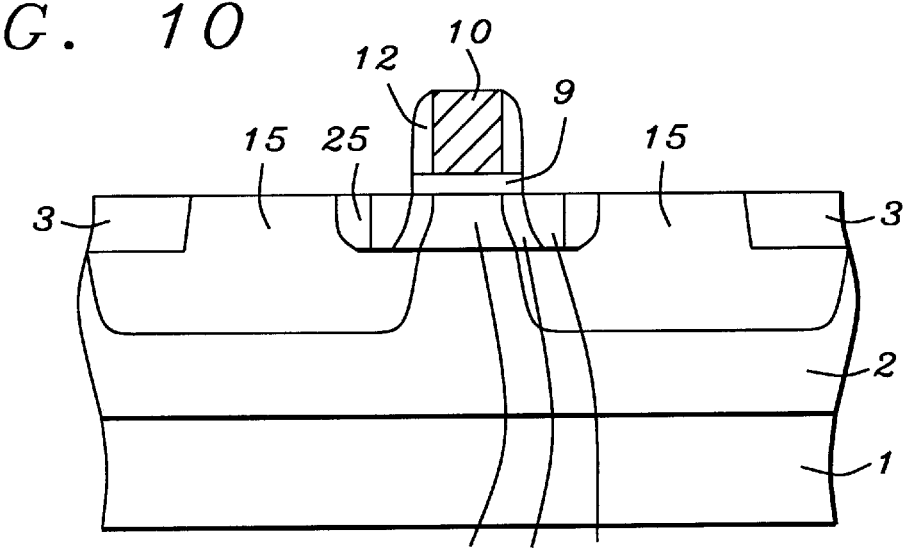

A second embodiment of this invention allowing a portion of a MOSFET device to overlay an insulator region, is next addressed. This embodiment will feature a silicon oxide region formed in an opening in the silicon alloy layer, later filled with a silicon oxide layer. Referring to FIG. 9, composite shapes 30, each comprised of underlying strained silicon shape 3, and overlying silicon oxide shape 24, are formed on underlying silicon alloy layer 2. Strained silicon shape 3, is obtained and defined using the identical processing procedures used to obtain the strained silicon shape of the first embodiment. Silicon oxide shape 24, is comprised of a silicon oxide layer obtained via LPCVD or PECVD procedures at a thickness between about 100 to 1,000 Angstroms, defined prior to definition of strained silicon shape 3, during an anisotropic RIE procedure using $CHF_3$ as an etchant. Silicon oxide spacers 25, are next formed on the sides of composite spacers 30, via deposition of a silicon oxide layer, at a thickness between about 100 to 1,000 Angstroms, using LPCVD or PECVD procedures, followed by an anisotropic RIE procedure, using $CHF_3$ as an etchant for silicon oxide. A selective dry etch procedure is next employed to remove exposed regions of silicon alloy layer 2, using $Cl_2$ or $SF_6$ as a selective etchant for silicon alloy layer 2. The dry etch procedure is performed at a pressure which introduces an isotropic component allowing isotropic opening 14, extending under the edges or periphery of composite shapes 30, to be realized. This is schematically shown in FIG. 9. A silicon oxide layer is next deposited via a high density plasma (HDP), procedure, to a thickness between about 1,000 to 5,000 Angstroms, completely filling opening 14. A chemical mechanical polishing procedure is next used to selectively remove regions of the HDP silicon oxide layer not located in opening 14, while also selectively removing silicon oxide shapes 24. The result of these procedures, schematically shown in FIG. 10, feature a planarized structure comprised of strained silicon shape 3, embedded in silicon oxide region 15, with peripheral regions of strained silicon shape 3, located overlying silicon oxide region 15. FIG. 11, schematically shows a MOSFET device formed in strained silicon shape 3, using the identical processes and thicknesses used in the first embodiment of this invention for formation of gate insulator layer 9, gate structure 10, lightly doped source/drain region 11, insulator spacers 12, and for heavily doped source/drain region 13.

Figure 12:
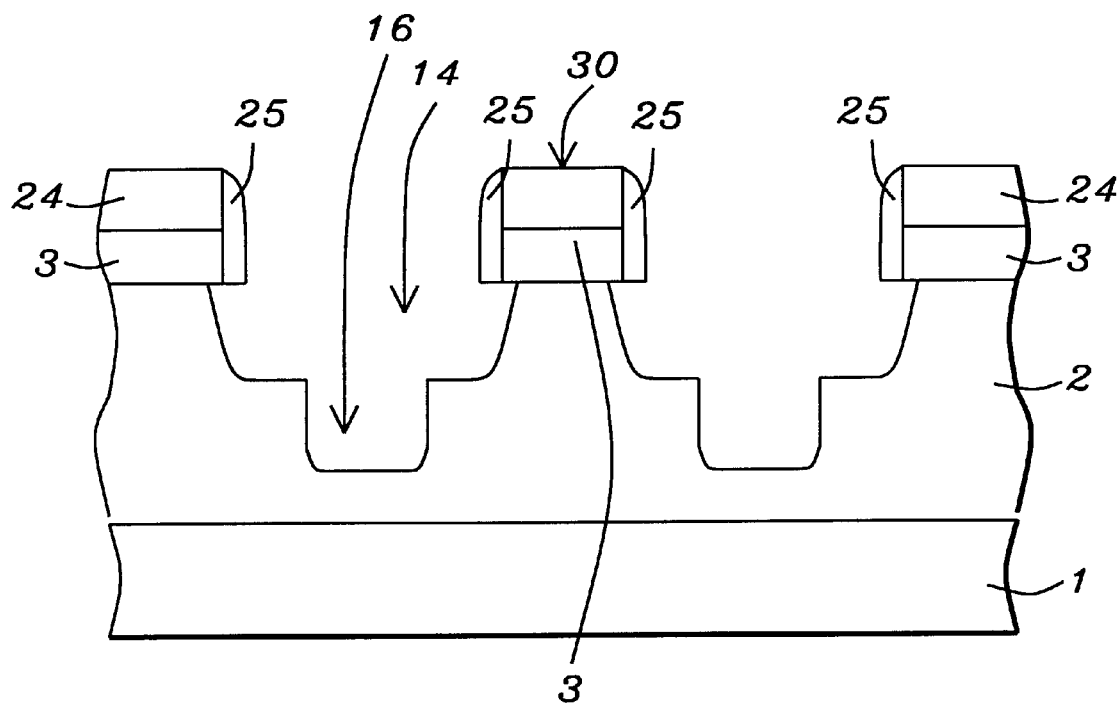
Figure 13:
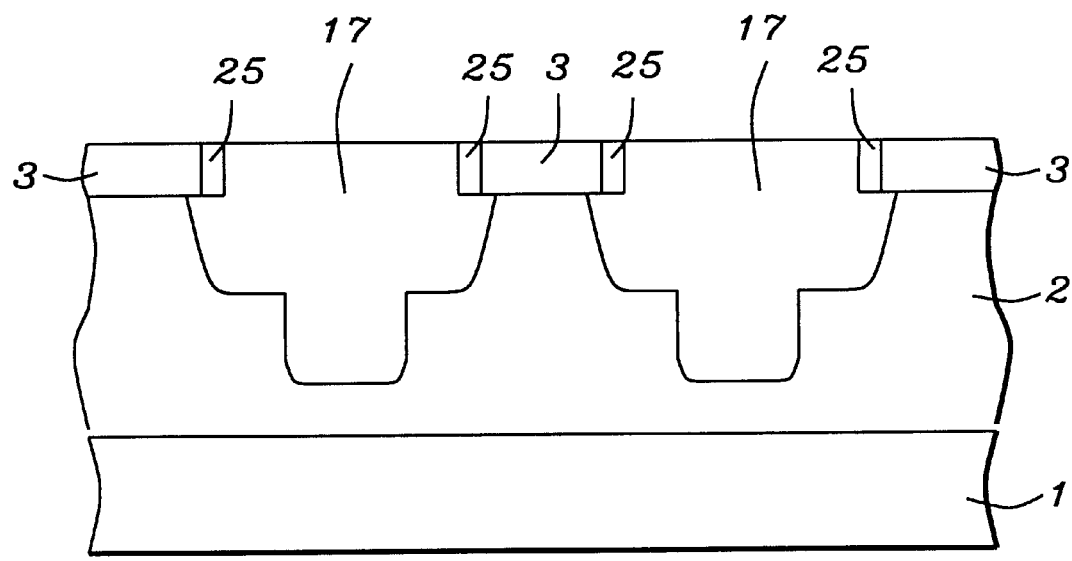

An iteration of the second embodiment, allowing a deeper refilled, silicon oxide region to be formed, is next addressed and described using FIGS. 12–13. After isotropically forming opening 14, in silicon alloy layer 2, as previously shown in FIG. 9, the pressure in the dry etch tool is decreased allowing anisotropic opening 16, to be formed in a lower region of silicon alloy layer 2. Opening 16, is formed in regions of silicon alloy layer defined in the space between composite shapes 30, via an anisotropic RIE procedure using $Cl_2$ or $SF_6$ as a selective etchant. This is schematically shown in FIG. 12. Filling of openings 14, and 16, is again accomplished via a HDP procedure, depositing silicon oxide layer 17, to a thickness between about 1,000 to 5,000 Angstroms, completely filling the openings. A chemical mechanical polishing procedure is then used to remove regions of silicon oxide layer 17, not located in openings 14, or 16, with the procedure also removing silicon oxide shapes 24. The result of the chemical mechanical polishing procedure is a planarized structure comprised of strained silicon shape 3, embedded in silicon oxide region 17, with the peripheral regions of strained silicon shape 3, located overlying silicon oxide region 17. This is schematically shown in FIG. 13.

While this invention has been particularly shown and described with reference to, the preferred embodiments thereof, it will be understood by those skilled in the art that various changes in form and details may be made without departing from the spirit and scope of this invention.

What is claimed is:

1. A method of forming a buried insulator region in a semiconductor substrate with portions of said buried insulator region formed underlying portions of a semiconductor shape, comprising the steps of:

forming a semiconductor alloy layer on said semiconductor substrate;

forming a semiconductor layer on said semiconductor alloy layer;

forming an insulator layer on said semiconductor layer;

forming composite shapes on said semiconductor alloy layer, with each composite shape comprised of an overlying insulator shape and comprised of an underlying semiconductor shape, with portions of said semiconductor alloy layer exposed between said composite shapes;

forming insulator spacers on the sides of said composite shapes;

forming buried insulator regions in top portions of said semiconductor alloy layer exposed between said composite shapes, with portions of said buried insulator regions formed underlying the semiconductor shapes of said composite shapes;

removing insulator shapes and said insulator spacers resulting in semiconductor shapes, wherein a first portion each semiconductor shape overlays said semiconductor alloy layer, and wherein second portions of each semiconductor shape overlays said buried insulator regions; and forming a semiconductor device in a semiconductor shape.

2. The method of claim 1, wherein said semiconductor alloy layer is a silicon-germanium layer.

3. The method of claim 2, wherein said silicon-germanium layer is denoted as $Si_{(1-y)}Ge_y$, wherein y is the mole percent of germanium, between about 5 to 55%.

4. The method of claim 1, wherein said semiconductor alloy layer is a silicon-germanium-carbon layer.

5. The method of claim 1, wherein said semiconductor layer is a strained silicon layer, grown at a thickness between about 5 to 5000 Angstroms.

6. The method of claim 1, wherein said insulator layer is a silicon nitride layer obtained via LPCVD or PECVD procedures, at a thickness between about 100 to 1000 Angstroms.

7. The method of claim 1, wherein said composite shapes are comprised of said silicon nitride insulator shapes, and comprised of underlying strained silicon semiconductor shapes, formed via an anisotropic RIE procedure.

8. The method of claim 1, wherein said insulator spacers are silicon nitride spacers, formed at a thickness between about 50 to 1000 Angstroms.

9. The method of claim 1, wherein said buried insulator regions are buried silicon oxide regions, formed at a thickness between about 2,000 to 12,000 Angstroms.

10. The method of claim 1, wherein said buried silicon oxide regions are obtained via thermal oxidation procedures performed at a temperature between about 700 to 1200° C., in an oxygen containing ambient.

11. The method of claim 1, wherein said insulator shapes and said insulator spacers are selectively removed using a hot phosphoric acid solution.

12. The method of claim 1, wherein said semiconductor device formed in said semiconductor layer is a MOSFET device, with source/drain regions of said MOSFET device formed overlying said buried insulator region, while a channel region of said MOSFET device is formed overlying said semiconductor alloy layer.

13. A method of forming a buried silicon oxide region in a semiconductor substrate, with portions of said buried silicon oxide region formed underlying portions of a strained silicon shape, comprising the steps of:

forming a semiconductor alloy layer on said semiconductor substrate;

growing a strained silicon layer on said semiconductor alloy layer;

depositing a silicon nitride layer on said strained silicon layer;

forming composite shapes on said semiconductor alloy layer, with each composite shape comprised of an overlying silicon nitride shape and comprised of an underlying strained silicon shape, with portions of said semiconductor alloy layer exposed between said composite shapes;

forming silicon nitride spacers on the sides of said composite shapes;

performing a thermal oxidation procedure to form buried silicon oxide regions in exposed top portions of said semiconductor alloy layer, and in portions of said semiconductor alloy layer located underlying strained silicon shapes;

selectively removing silicon nitride shapes and said silicon nitride spacers resulting in said strained silicon shapes, wherein a first portion of each strained silicon shape overlays said semiconductor alloy layer, and wherein second portions of each strained silicon shape overlays said buried silicon oxide regions; and forming a semiconductor device in a strained silicon shape wherein a first portion of said semiconductor device overlays said semiconductor alloy layer and wherein second portions of said semiconductor device overlays a buried silicon oxide region.

14. The method of claim 13, wherein said semiconductor alloy layer is a silicon-germanium layer.

15. The method of claim 13, wherein said silicon-germanium layer is denoted as $Si_{(1-y)}G_y$, wherein y is the mole percent of germanium, between about 5 to 55%.

16. The method of claim 13, wherein said semiconductor alloy layer is a silicon-germanium-carbon layer.

17. The method of claim 13, wherein said strained silicon layer is obtained via epitaxial growth procedures.

18. The method of claim 13, wherein said strained silicon layer is formed at a thickness between about 5 to 5,000 Angstroms.

19. The method of claim 13, wherein said silicon nitride layer is obtained via LPCVD or PECVD procedures, at a thickness between about 100 to 1,000 Angstroms.

20. The method of claim 13, wherein said composite shapes, comprised of said silicon nitride insulator shapes and comprised of underlying strained silicon shapes, are formed via an anisotropic RIE procedure using $Cl_2$ as an etchant.

21. The method of claim 13, wherein said silicon nitride spacers are formed at a thickness between about 50 to 1,000 Angstroms.

22. The method of claim 13, wherein said buried silicon oxide regions are obtained via thermal oxidation procedures performed in an oxygen containing ambient.

23. The method of claim 13, wherein said buried silicon oxide regions are formed at a thickness between about 2,000 to 12,000 Angstroms.

24. The method of claim 13, wherein said silicon nitride shapes and said silicon nitride spacers are selectively removed using a hot phosphoric acid solution.

25. The method of claim 13, wherein said semiconductor device formed in said strained silicon layer is a MOSFET device, with source/drain regions of said MOSFET device formed overlying said buried silicon oxide region, while a channel region of said MOSFET device is formed overlying said semiconductor alloy layer.

26. A method of forming a buried silicon oxide region in a semiconductor substrate, with portions of said buried silicon oxide region formed underlying portions of a strained silicon shape, comprising the steps of forming a semiconductor alloy layer on said semiconductor substrate;

growing a strained silicon layer on said semiconductor alloy layer;

depositing a first silicon oxide layer on said strained silicon layer;

forming composite shapes on said semiconductor alloy layer, with each composite shape comprised of an overlying silicon oxide shape and comprised of an underlying strained silicon shape, with portions of said semiconductor alloy layer exposed between said composite shapes;

forming silicon oxide spacers on the sides of said composite shapes;

performing an etch procedure to form openings in said semiconductor alloy layer, with each opening defined in a top portion of said semiconductor alloy layer located between said composite shapes, and with said opening extending into top portions of said semiconductor alloy layer located underlying portions of strained silicon shapes;

depositing a second silicon oxide layer completely filling said openings in said semiconductor alloy layer;

performing a planarization procedure to form said buried silicon oxide regions in said openings, with said planarization procedure also removing said silicon oxide shapes from the top surface of said strained silicon shapes, resulting in strained silicon shapes featuring a first portion overlaying said semiconductor alloy layer, and featuring second portions of each strained silicon shape located overlaying said buried silicon oxide regions; and forming a semiconductor device in a strained silicon shape wherein a first portion of said semiconductor device overlays said semiconductor alloy layer and wherein second portions of said semiconductor device overlays a buried silicon oxide region.

27. The method of claim 26, wherein said semiconductor alloy layer is a silicon germanium layer.

28. The method of claim 26, wherein said silicon-germanium layer is denoted as $Si_{(1-y)}Ge_y$, wherein y is the mole percent of germanium, between about 5 to 55%.

29. The method of claim 26, wherein said semiconductor alloy layer is a silicon-germanium-carbon layer.

30. The method of claim 26, wherein said strained silicon layer is obtained via epitaxial growth procedures.

31. The method of claim 26, wherein said strained silicon layer is formed at a thickness between about 5 to 5,000 Angstroms.

32. The method of claim 26, wherein said first silicon oxide layer is obtained via LPCVD or PECVD procedures, at a thickness between about 100 to 1,000 Angstroms.

33. The method of claim 26, wherein said composite shapes, comprised of said silicon oxides shapes and comprised of underlying strained silicon semiconductor shapes, are formed via a RIE procedure.

34. The method of claim 26, wherein said silicon oxide spacers are formed at a thickness between about 100 to 1,000 Angstroms.

35. The method of claim 26, wherein said openings in top portions of said semiconductor alloy layer, are formed via a dry etching procedure using $Cl_2$ or $SF_6$ as an etchant, featuring a pressure allowing an isotropic etch component to be realized.

36. The method of claim 26, wherein said second silicon oxide layer used to fill said openings, is obtained via a high density plasma deposition procedure at a thickness between about 1,000 to 5,000 Angstroms.

37. The method of claim 26, wherein said planarization procedure used to form said buried silicon oxide regions, is a chemical mechanical polishing procedure.

38. The method of claim 26, wherein said semiconductor device formed in said strained silicon layer is a MOSFET device, with source/drain regions of said MOSFET device formed overlying said buried silicon oxide region, while a channel region of said MOSFET device is formed overlying said semiconductor alloy layer.

* * * * *